United States Patent [19]

Burnham et al.

[11] Patent Number: 4,839,899
[45] Date of Patent: Jun. 13, 1989

[54] WAVELENGTH TUNING OF MULTIPLE QUANTUM WELL (MQW) HETEROSTRUCTURE LASERS

[75] Inventors: Robert D. Burnham, Wheaton, Ill.; Donald R. Scifres, Los Altos Hills, Calif.

[73] Assignee: Xerox Corporation, Stamford, Conn.

[21] Appl. No.: 165,863

[22] Filed: Mar. 9, 1988

[51] Int. Cl.$^4$ .............................. H01S 3/19
[52] U.S. Cl. ........................ 372/45; 372/20
[58] Field of Search ............... 372/20, 45, 50; 357/16, 357/17

[56] References Cited

U.S. PATENT DOCUMENTS

| 4,589,115 | 5/1986 | Burnham et al. | 372/20 |
| 4,730,331 | 3/1988 | Burnham et al. | 372/50 |
| 4,745,612 | 5/1988 | Hayakawa et al. | 372/45 |
| 4,787,089 | 11/1988 | Kayakawa et al. | 372/45 |

OTHER PUBLICATIONS

J. J. Colman et al., "Induced Phonon-Sideband Laser Operation of Large-Quantum-Well $Al_xGa_{1-x}$-As-GaAs Heterostructures ($L_z \sim 200$–500 Å)", Applied Physics Letters, vol. 37(1), pp. 15–17, Jul. 1, 1980.

Primary Examiner—James W. Davie
Attorney, Agent, or Firm—W. Douglas Carothers, Jr.

[57] ABSTRACT

The thermalization process is effectively slowed down by reducing the tunneling or communication probability between adjacent quantum wells of a MQW heterostructure laser to increase the number of allowable subbands in the wells and thereby correspondingly increase the range of wavelength tuning of such lasers. This increase of allowable subbands is accomplished by (A) either (1) spatially varying the elemental composition of the wells or barriers or both in order to spatially increase or decrease the energy band from well to well or (2) spatially varying the thickness of the wells or barriers or both in order to spatially increase or decrease the energy band from well to well, or (B) a combination of (1) and (2) of (A).

9 Claims, 9 Drawing Sheets

WAVELENGTH TUNING OF MULTIPLE QUANTUM WELL (MQW) HETEROSTRUCTURE LASERS

BACKGROUND OF THE INVENTION

This invention relates to semiconductor lasers and more particularly to multiple quantum well (MQW) lasers that have their operating or primary emission wavelength tuned selectively to a different emission wavelength. This invention is an improvement of and extension to Burnham et al, U.S. Pat. No. 4,589,115, issued May 13, 1986.

In U.S. Pat. No. 4,589,115, there is disclosed the method for tuning the wavelength of quantum well injection lasers, both single and multiple well type, using an external grating wherein the range of operating wavelength selection is extended, beyond the expectations of wavelength selection possible in bulk crystal heterostructure lasers, to include wavelength selection at the multiple carrier recombination transition energies possible in the conduction band subbands and valence band subbands existing in quantum well heterostructures. Quantum well heterostructure lasers have an unique advantage of being band filled to well above the bulk crystan band edge at moderate current densities indicative of broad band tuning through a wide range of quantum well subbands of the quantum well structure of such lasers U.S. Pat. No. 4,589,115 is incorporated herein by reference thereto.

MQW heterostructure lasers, however, are believed not to band fill as easily as a thin single quantum well (SQW) heterostructure laser because electrons tend to thermalize faster to the lowest subband states in MQW heterostructure lasers compared to SQW heterostructure lasers.

It is a principal object of this invention to extend the tuning range of MQW heterostructure lasers by effectively slowing down this thermalization process.

SUMMARY OF THE INVENTION

According to this invention, the thermalization process is effectively slowed down by reducing the tunneling or communication probability between adjacent quantum wells of a MQW heterostructure laser to increase the number of allowable subbands in the wells and thereby correspondingly increase the range of wavelength tuning of such lasers. This increase of allowable subbands is accomplished by (A) either (1) spatially varying the elemental composition of the wells or barriers or both in order to spatially increase or decrease the energy band from well to well or (2) spatially varying the thickness of the wells or barriers or both in order to spatially increase or decrease the energy band from well to well, or (B) a combination of (1) and (2) of (A). A multitude of embodiments are described which provide for an increase of allowable subbands in heterostructure wells or provide for dominate multiple wavelength emission from the same optical cavity.

Other objects and attainments together with a fuller understanding of the invention will be come apparent and appreciated by referring to the following description and claims taken in conjunction with the accompanying drawings.

DETAILED DESCRIPTION OF THE PREFERRED EMBODIMENTS

Figure 1:
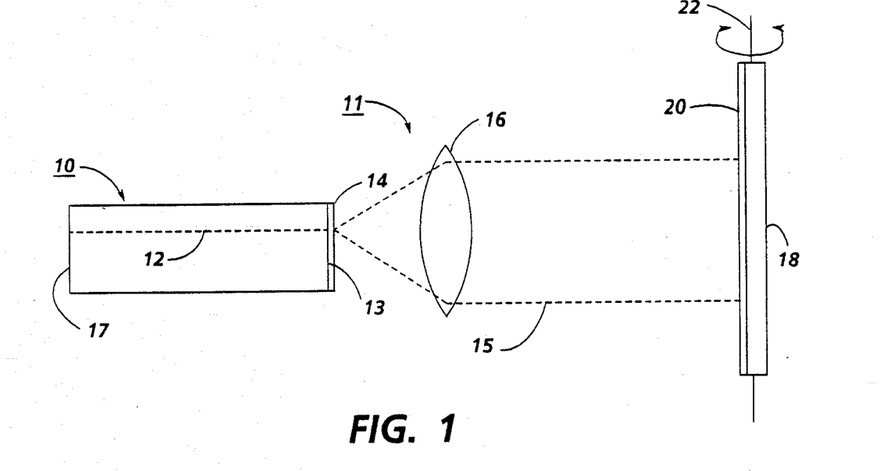
FIG. 1 is a schematic illustration of a side elevation of a tuning system to provide selective wavelength feedback via a MQW heterostructure laser comprising this invention.
Figure 2:
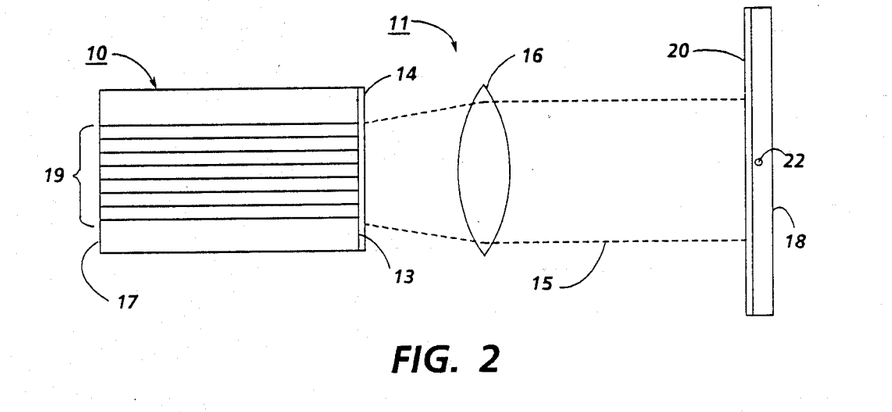
FIG. 2 is a schematic illustration of a plan elevation of the tuning system shown in FIG. 1.

Reference is now made to FIGS. 1 and 2 wherein there is illustrated a wavelength selective feedback system 11 comprising a MQW heterostructure laser 10 having a p-n junction and optical cavity represented by dotted line 12. Laser 10 has a plurality of laser emitters with current confinement means separated by current confinement stripes extending for the full length of laser 10. It should be noted that laser 10 may be comprised also of a single emitter laser but for purposes of the present explanation, a multi-emitter has been illustrated. In either case, laser 10 has an active region comprising a series of quantum wells separated by barriers, as will be explained in greater detail later.

One facet of laser 10 is provided with an antireflection (AR) coating 14. AR coating 14 reduces the reflectivity at laser facet 13 to about 5% or less. The output from AR coated facet 13 is collimated via objective lens 16 having, for example, a numerical aperture equal to 0.95 and a focal length of 25 mm to a diffraction grating plate 18. Plate 18 contains on its front surface a grating pattern 20, e.g., 1200 lines/mm (6000 Å blaze).

The grating rulings of pattern 25 are perpendicular to p-n junction 12 of laser 10 so that the grating is rotatable about an axis 22 perpendicular to the junction plane. As reported by Paoli et al, in the article, "Single Longitudinal Mode Operation of CW Junction Lasers By Frequency-Selective Optical Feedback", Applied Physics Letters, Vol. 25(12), pp. 744-746, Dec. 15, 1974, this arrangement for the grating ruling relieves the necessity for critical alignment of grating 20 relative to the laser output encountering parallel grating orientation.

Grating 20 is a high reflecting blazed grating and functions like a spectral filter providing a wavelength selective reflection which if fed back from the grating through the lens 16 onto the plane of laser facet 13 into multiemitter optical cavity 12 of laser 10. The relative position of the laser current confinement stripes and the dispersed spectrum focused to the facet plane determines the lasing wavelength. The wavelength of laser 10 may be selectively tuned or changed by rotating grating 18 as is well known in the art. Selective tuning may be also accomplished by use of a dielectric stack reflector in place of grating 20 which is angularly rotated relative tot he collimated beam from laser 10. Further, selective tuning may be accomplished by use of a corner cube prism which is rotated about an axis perpendicular to the collimated beam from laser 10.

Thus, the path between AR coated facet 13 and grating 20 forms a Fabry-Perot cavity for laser 10. The emission wavelength of laser 10 may be monitored from beam emerging from the other facet 17, which beam may be employed in an application requiring selected wavelength operation within the operating emission spectra of laser 10. Alternatively, light may removed from the grating side of teh cavity by using light diffracted into a different order of the grating or by allowing the grating to be partially transmitting.

In order to have a wide range of wavelength tuning, it is important to have a band filled quantum well to support stimulated emission over a wide energy range as explained in U.S. Pat. No. 4,589,115. As illustrated by the dotted lines in the SQW heterostructure in FIG. 3A, there are a large number of energy levels, representing energy bands in the well, having increasing energy states at the subband edges. However, as illustrated by the dotted lines in the MQW heterostructures illustrated in FIG. 3B, there is a limited number of energy levels of increasing energy states at the subband edges and, as a result, the possible number of energy states are even more limited, as illustrated in these figures. It is believed that electrons falling into these wells do not band fill in these MQW structures because they tend to thermalize faster to the lowest available subband states of the structure. By reducing the tunneling probability of electrons between adjacent barriers separated by wells of MQW structures, this thermalization process can be relaxed so that MQW heterostructures will behave more like a series of separated SQW heterostructures illustrated in FIG. 3C. This can be accomplished by spatially varying the elemental composition and/or thickness of the wells and/or barriers of a MQW heterostructure. FIGS. 4–7 are examples of different MQW configurations that may be utilized as the active region for a MQW heterostructure laser 10 to provide for improvement in the tunability of wavelength selection in such lasers because these structures significantly increase the number of allowable subbands thereby increasing the number of possible tuned wavelengths as well as the range of selectable wavelengths.

Figures 3A, 3B, 3C, 4:
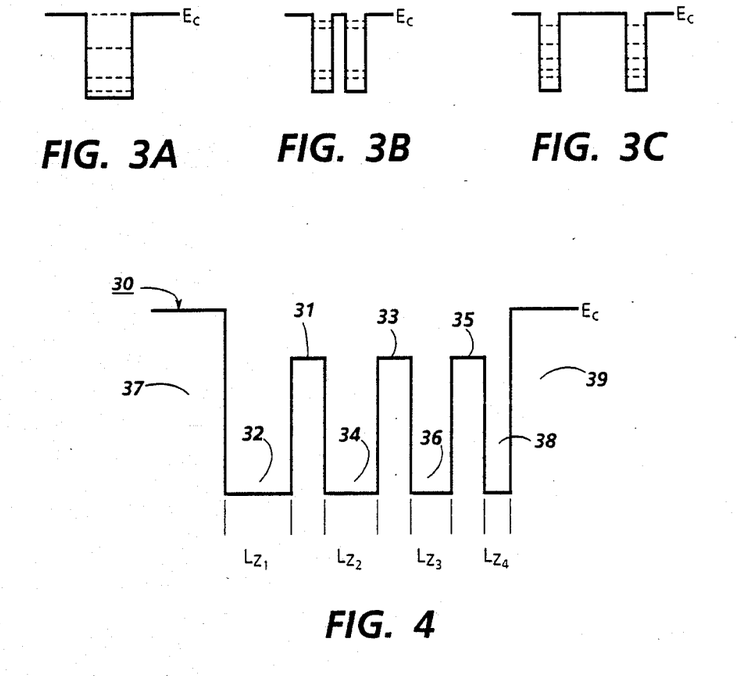
FIGS. 3A, 3B and 3C energy band profiles for SQW and MQW heterostructures illustrating the change in tunneling probability between the two types of structures.
FIG. 4 is an energy band profile configuration for a MQW heterostructure laser of FIGS. 1 and 2 with spatial variation in well thickness.

In FIG. 4, the energy band profile 30 comprises four quantum wells 32, 34, 36 and 38, for example, consisting of $Ga_{1-x}Al_xAs$ where x may be, for example, about 0.05. Each well is of a different thickness, $L_z$, and of decreasing thickness across the array of wells starting with well 32, i.e., $L_{z1} > L_{z2} > L_{z3} > L_{z4}$. As a specific example, $L_{z1}$, may be 100 Å, $L_{z2}$ may be 80 Å, $L_{z3}$ may be 60 Å and $L_{z4}$ may be 40 Å. The wells 32-38 are separated by barriers 31, 33 and 35 which are of equal thickness, e.g. 50 Å thick, and may be comprised of $Ga_{1-x'}Al_{x'}As$ where x' may be, for example, about 0.35. Cladding layers 37 and 39 may be comprised of $Ga_{1-y}Al_yAs$ where y may be, for example, about 0.60. The alternate embodiment of FIG. 4 would be barriers 31-35 having increasing or decreasing thickness across the array, such as illustrated in FIG. 6 at $L_{B1}$, $L_{B2}$, $L_{B3}$, while wells 32-38 would be of substantially equal thickness.

Figure 5:
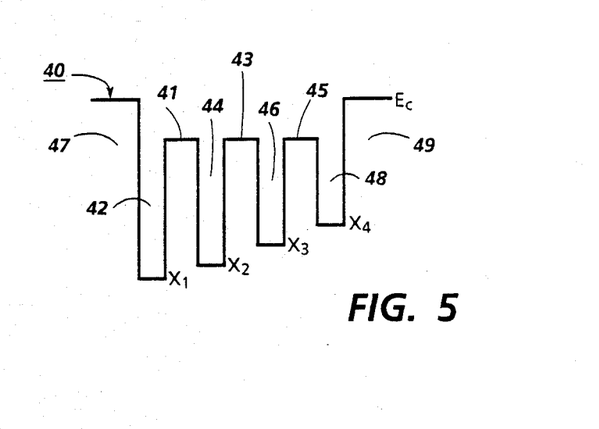
FIG. 5 is an energy band profile configuration for a MQW heterostructure laser of FIGS. 1 and 2 with spatial variation in well elemental composition.

In FIG. 5, the energy band profile 40 comprise four quantum wells 42, 44, 46 and 48, of increasing Al content, consisting, for example, of $Ga_{1-x}Al_xAs$ where, for example, $x_1$ for well 42 may be about 0.05, $x_2$ for well 44 may be about 0.7, $x_3$ for well 46 may be about 0.9 and $x_4$ for well 48 may be about 0.11, i.e., $x_1 < x_2 < x_3 < x_4$. Wells 42-48 are of equal thickness, for example, $L_z$ may be equal to 40 Å. Wells 42-48 are separated by barriers 42, 43 and 45 which are of equal thickness, e.g., 50 Å thick, and may be comprised of $Ga_{1-x'}Al_{x'}As$ where x' may be, for example, about 0.40. Cladding layers 47 and 49 may be comprised of $Ga_{1-y}Al_yAs$ where y may be, for example, about 0.65. The alternate embodiment of FIG. 4 would be barriers 41-45 having increasing or decreasing Al content across the array, such as illustrated in FIG. 7 at $x'_1$, $x'_2$, $x'_3$ and $x'_4$ while wells 42–48 would be of substantially equal Al content.

Figure 6:
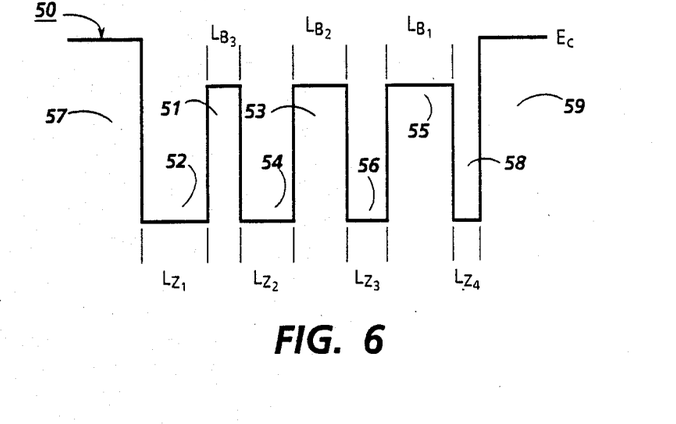
FIG. 6 is an energy band profile configuration for a MQW heterostructure laser of FIGS. 1 and 2 with spatial variation in well and barrier thickness.

In FIG. 6, the energy band profile 50 comprises four quantum wells 52, 54, 56 and 58, for example, consisting of $Ga_{1-x}Al_xAs$ where x may be, for example, about 0.05. Each well is of a different thickness and of decreasing thickness, $L_z$, across the array of wells starting with well 52, i.e., $L_{z1} > L_{z2} > L_{z3} > L_{z4}$. As a specific example, $L_{z1}$, may be 100 Å, $L_{z2}$ may be 80 Å, $L_{z3}$ may be 60 Å and $L_{z4}$ may be 40 Å. Wells 52–58 are separated by barriers 51, 53 and 55 consisting of $Ga_{1-x'}Al_{x'}As$ where $x'$ may be, for example, about 0.35. Each barrier is of a different thickness, $L_B$, starting with barrier 55, i.e., $L_{B1} > L_{B2} > L_{B3}$. As a specific example, $L_{B1}$ may be 140 Å, $L_{B2}$ may be 90 Å, $L_{B3}$ may be 90 Å and $L_{B4}$ may be 50 Å. Cladding layers 57 and 59 may be comprised of $Ga_{1-y}Al_yAs$ where y may be, for example, about 0.60.

The alternative embodiment of FIG. 6 would be barriers 51–55 having increasing thickness across the array in the same direction as the increasing thickness of wells 52–58 rather than in the opposite direction as illustrated in FIG. 6.

Figure 7:
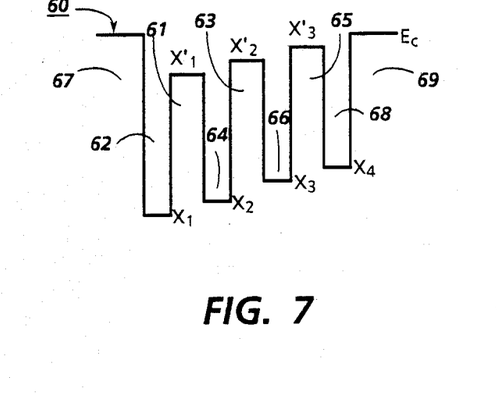
FIG. 7 is an energy band profile configuration for a MQW heterostructure laser of FIGS. 1 and 2 with spatial variation in well barrier elemental composition.

In FIG. 7, the energy band profile 60 comprises four quantum wells 62, 64, 66 and 68 of increasing Al content, for example consisting of $Ga_{1-x}Al_xAs$ starting with well 62, i.e. $x_1 < x_2 < x_3 < x_4$. As a specific example, $x_1$ for well 62 may be about 0.05, $x_2$ for well 64 may be about 0.7, $x_3$ for well 66 may be about 0.9 and $x_4$ for well 68 may be about 0.11. Wells 62–68 are separated by barriers 62, 63 and 65 of $Ga_{1-x'}Al_{x'}As$ having increasing Al content across the array starting with barrier 61, i.e., $x'_1 < x'_2 < x'_3$. As a specific example, $x'_1$ may be 0.35, $x'_2$ may be 0.40 and $x'_3$ may be 0.45. Cladding layers 67 and 69 may be comprised of $Ga_{1-y}Al_yAs$ where y may be, for example about 0.60.

The alternative embodiment of FIG. 7 would be barriers 61–65 having increasing Al content across the array in an opposite direction to the increasing Al content of wells 62–68 rather than in the same direction as illustrated in FIG. 7.

The forgoing illustrations of FIGS. 4–7 relate to increasing or decreasing changes across the array of wells or barriers either as to Al content or thickness. however, combinations of FIGS. 4–7 may also be utilized in the MQW heterostructure such that there may be in a single structure, increasing or decreasing thickness across the array of wells and/or barriers in combination with increasing or decreasing Al content across the array of wells and/or barriers. Also, the thickness of the wells and/or barriers may increase laterally in one direction while the Al content of the wells and/or barriers increase laterally in the opposite direction or, alternatively, increase laterally with well or barrier thickness in the same direction.

The foregoing illustrations also can obviously employ different increasing or decreasing percentages of Al content in the wells or different increasing or decreasing variations in thickness of wells and/or barriers. Further, the number of wells and barriers need not be limited to respectively four and three, as illustrated, as any number of multiple wells and separating barriers may be utilized with the features of this invention in the MQW active region of laser 10.

Various other configuration are possible utilizing the basic concepts discussed and disclosed in FIGS. 4–7 as well as various differnt variations thereof including multiple quantum well sawtooth superlattices (MQW SATH SL) structures and multiple quantum well superlattices (MQW SL) structures having several dominate wavelengths. Examples of such additional configurations are set forth in FIGS. 8–24.

Figure 8:
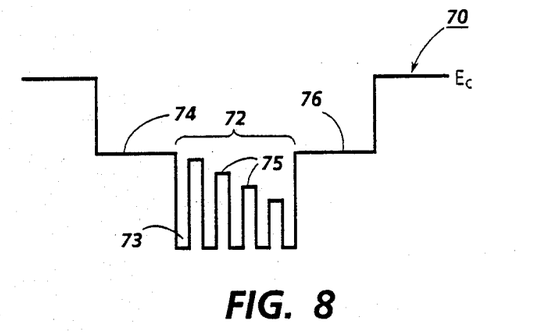
FIG. 8 is an energy band profile configuration for a separate confinement multiple quantum well structure with varying barrier heights.

In FIG. 8, an energy band profile 70 comprises a multiple quantum well active region 72 bounded by inner cladding layers 74 and 76 to form a separate confinement multiple quantum well structure. In structure 70, region 72 comprises a plurality of wells 73 of equal level separated by barriers 75 of decreasing barrier height. Wells 73, for example, may be comprised of GaAs or $Ga_{1-x}Al_xAs$, where x is of small value, e.g. $x = 0.05$. Barriers may be comprised of $Ga_{1-y}Al_yAs$ and confinement layers 74 and 76 may be comprised of $Ga_{1-z}Al_zAs$ where $z > y > x$. The Al compositional content of barriers 75 decreases linearly between the values of z and x.

Figure 9:
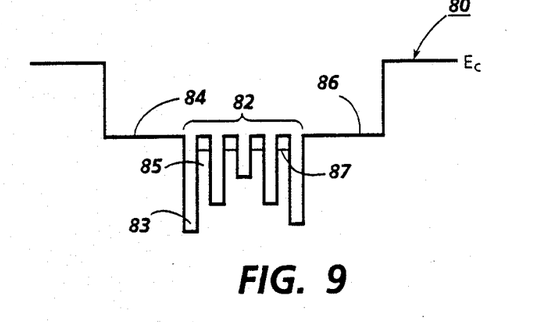
FIG. 9 is an energy band profile configuration for a separate confinement multiple quantum well structure with varying well heights.

In FIG. 9, an energy band profile 80 comprises a multiple quantum well active region 82 bounded by inner cladding layers 84 and 86 to form a separate confinement multiple quantum well structure. Active region 82 comprises a plurality of wells 83 separated by barriers 85. In the embodiment here, the barriers 85 are of equal height while wells 83 laterally increase in height toward the center of active region 82 and thereafter decrease in ehight to the appropriate edge of the region. Wells 83, for example, may be comprised of $Ga_{1-x}Al_xAs$ where x varies from 0 to 0.10 to the center of active region 82 and then back to 0. Barriers 85 and inner cladding layers 84 and 86 may be comprised of $Ga_{1-z}Al_zAs$ where $z > x$ or, alternatively cladding layers 84 and 86 may be comprised of $Ga_{1-z}Al_zAs$ and barriers 85 may be comprised of $Ga_{1-y}Al_yAs$, as indicated by dotted lines 87, where $z > y > x$.

Figure 10:
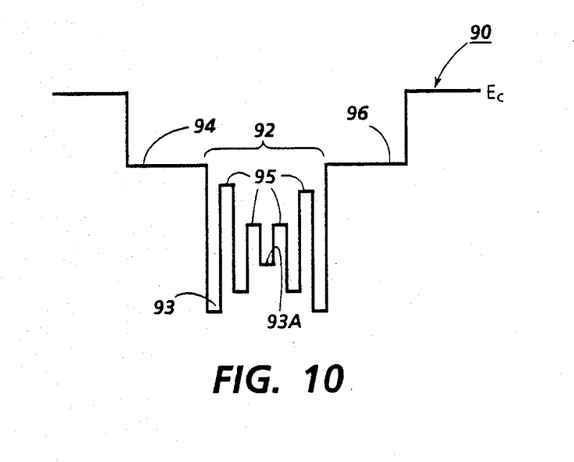
FIG. 10 is an energy band profile configuration for a separate confinement multiple quantum well structure with varying well and barrier heights.

In FIG. 10, energy band profile configuration or structure 90 is similar to structure 80 of FIG. 9 except that active region comprises a multiple quantum well having combination monotonic variances in both well and barrier height. Structure 90 comprises a multiple quantum well active region 92 bounded by inner cladding layers 94 and 96 of $Ga_{1-z}Al_zAs$ to form a separate confinement multiple quantum well structure. Active region 92 comprises a plurality of wells 93 separated by barriers 95. Wells 93 and barriers 95 which, respectively, monotonically increase and decrease in height to the center of active region 92 and thereafter, respectively, monotonically decrease and increase in height to the opposite edge of the region. Thus, wells 93 have a central well 93A of higher transition energy levels compared to wells adjacent to central well 93A. Wells 93, for example, may be comprised of $Ga_{1-x}Al_xAs$ where x varies from 0 to 0.10 to center well 93A and then back to 0 and barriers 95 are comprised of $Ga_{1-y}Al_yAs$ where y varies between z and x, e.g., z may be 0.40 and y may be from 0.30 to 0.20 to 0.30.

Figure 11:
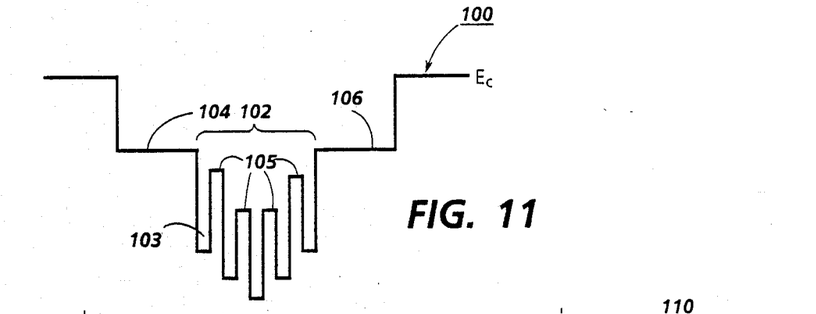
FIG. 11 is an energy band profile configuration for another embodiment of a separate confinement multiple quantum well structure with varying well and barrier heights.

In FIG. 11, energy band profile configuration for structure 100 is similar to structure 90 of FIG. 10 except that the active region wells monotonically decrease and increase concurrently with the active region barriers in height. Structure 100 comprises a multiple quantum well active region 102 bounded by inner cladding layers 104 and 106 of $Ga_{1-z}Al_zAs$ to form a separate confinement multiple quantum well structure. Active region 102 comprises a plurality of wells 103 and barriers 105, which monotonically decrease in height to the center of active region 102 and, thereafter, increase in height to the opposite side of region 102. Wells 103, for example, may be comprised of $Ga_{1-x}Al_xAs$, where x varies from 0 at the center to 0.10 at the sides and barriers 105 may be comprised of $Ga_{1-y}Al_yAs$, where y varies from between z and x, e.g., z may be 0.40 and y may be from 0.30 to 0.20 to 0.30.

Figure 12:
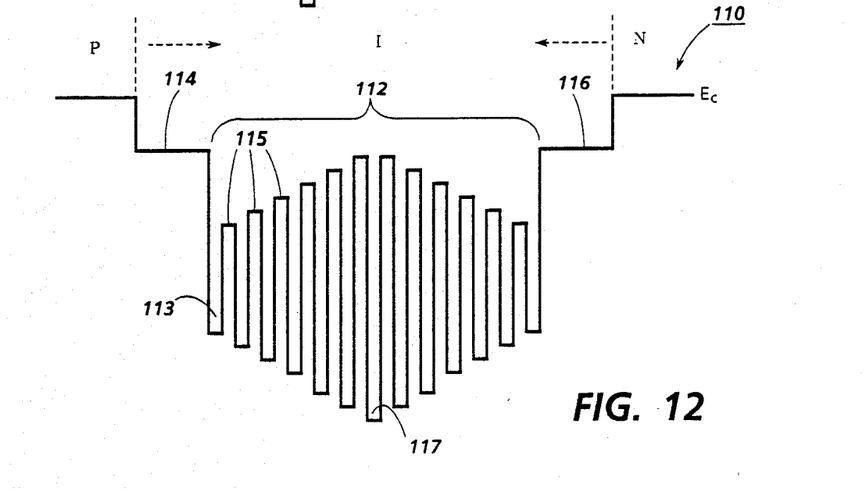
FIG. 12 is an energy band profile configuration for a further embodiment of a separate confinement multiple quantum well structure with varying well and barrier heights.

In FIG. 12, energy band profile configuration for structure 110 is similar to structure 100 of FIG. 11 except that the active region barriers 115 monotonically increase and then decrease in height laterally across the active region as the active region wells decrease and increase in height laterally across the active region. Structure 110 comprises a multiple quantum well active region 112 bounded by inner cladding layers 114 and 116 of $Ga_{1-z}Al_zAs$ to form a separate confinement multiple quantum well structure. Active region 112 comprises a plurality of wells 113 and barriers 115, which, respectively, decrease and increase in height to the center of active region 112 and thereafter, respectively, increase and decrease in height to the opposite side of the region. Thus, well 117 has the lowest transition energy levels compared to any wells adjacent to central well 117. Wells 113, for example, may be comprised of $Ga_{1-x}Al_xAs$ where x varies from 0.15 to 0 to 0.15. Central well 117 may be GaAs. Barriers 115 are comprised of $Ga_{1-y}Al_yAs$ where y varies between z and x, e.g., z may be 0.45 and y may be from 0.25 to 0.35 to 0.25.

Besides lateral monotonic variances in compositional content of the wells and barriers, different monotonic variances may also be provided in well and barrier thicknesses in the multiple quantum well active region either independently of or concurrently with monotonic changes in compositional content. This variation may readily apply to all the embodiments of FIGS. 8–12.

In FIG. 12 as well as in FIG. 13, to be discussed next, and example of the the position of the P-I-N doped regions in the structures are shown. Similar junction configurations may be also applied to each of the structures of the other embodiments in this application. This junction arrangement may be modified by decreasing the width of the I region down to zero, if so desired. In that particular case, however, it should be noted that such a doping profile that includes one or more quantum wells 117 (or 123 in FIG. 13) heavily doped P-type or N-type may no longer be efficiently filled with injected carriers, narrowing the carrier capture efficiency.

Figure 13:
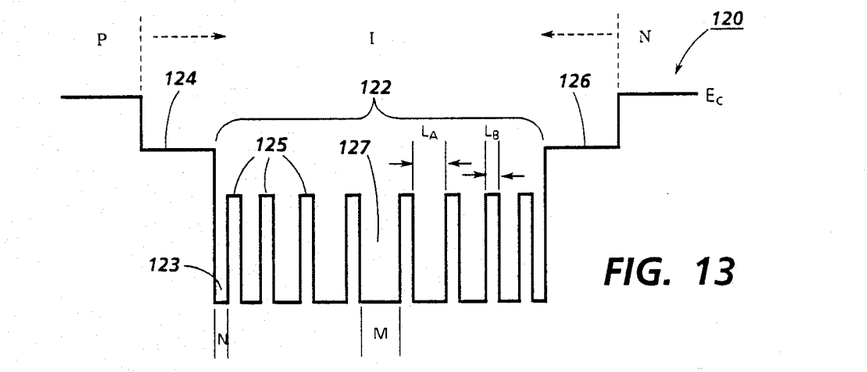
FIG. 13 is an energy band profile configuration for a separate confinement multiple quantum well structure with varying well widths.

In FIG. 13, energy band profile for structure 120 comprises a multiple quantum well active region 122 bounded by cladding layers 124 and 126 of $Ga_{1-z}Al_zAs$ to form a separate confinement multiple quantum well structure. Active region 122 comprises a plurality of wells 123 separated by barriers 125. Barriers 125 are of equal width, $L_B$, while wells 123 vary in width, $L_A$, from a minimum value, N at the ends of region 122 to a maximum value, M, at central well 127 of region 122. Wells 123, for example, may be comprised of GaAs or $Ga_{1-x}Al_xAs$, where x is a small value, e.g. 0.05 and barriers 125 may be comprised of $Ga_{1-y}Al_yAs$ where $z>y>x$. $L_A$ may, for example, be equal to M=2 N where $N+L_B$ may be 20 Å.

Figure 14:
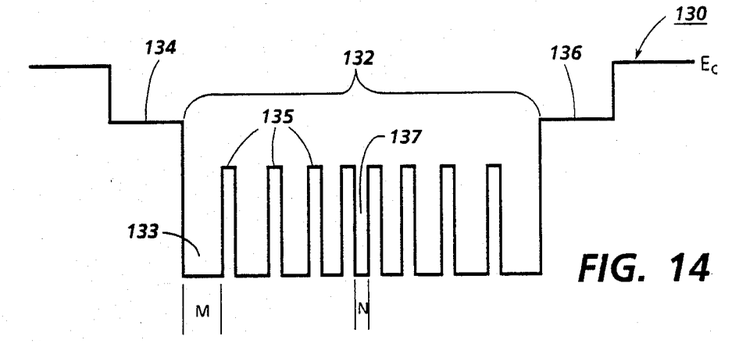
FIG. 14 is an energy band profile configuration for another embodiment of a separate confinement multiple quantum well structure with varying well widths.

In FIG. 14, energy band profile configuration for structure 130 is similar to structure 120 of FIG. 13 except that the periodicity of change in well thickness is opposite to that shown in FIG. 13. Structure 130 comprises a multiple quantum well active region 132 bounded by cladding layers 134 and 136 of $Ga_{1-z}Al_zAs$ to form a separate confinement multiple quantum well structure. Active region 132 comprises a plurality of wells 133 separated by barriers 135. Barriers 135 are of equal width, $L_B$, while wells 133 vary in width, $L_A$, from a maximum value, M, at the ends of region 132 to a minimum value, N, at center well 127 of region 132. Wells 133, for example, may be comprised of GaAs or $Ga_{1-x}Al_xAs$, where x is a small value, e.g. 0.05 and barriers 135 may be comprised of $Ga_{1-y}Al_yAs$ where $z>y>x$. $L_A$ may, for example, be equal to M=2 N where $N+L_B$ may be 20 Å.

Figure 15:
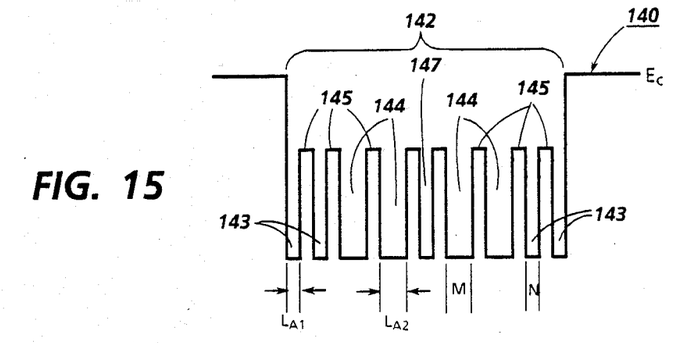
FIG. 15 is an energy band profile configuration for a further embodiment of a separate confinement multiple quantum well structure with varying well widths.

In FIG. 15, the energy band profile for structure 140 is a hybrid combination of structures 120 and 130 of FIG. 13 and 14. Structure 140 comprises a multiple quantum well active region 142 having a plurality of wells 143 and 144 separated by barriers 145. Barriers 145 are of equal width, $L_B$, and wells 143 are of a width, $L_{A1}$ and wells 144 are of a width $L_{A2}$. However, wells 144 are of greater width than wells 143, e.g., $L_{A2} = 2L_{A1}$. Center well 147 has a narrower width, $L_{A1}$, while pairs of adjacent wells 144 have a wider width, $L_{A2}$. The pairs of wells 143 at the opposite ends of MQW active region 142 have a narrow width, $L_{A1}$. Wells 143, for example, may be comprised of GaAs or $Ga_{1-x}Al_xAs$, where x is s small value, e.g. 0.05 and barriers 145 may be comprised of $Ga_{1-y}Al_yAs$ where $z>y>x$.

Figure 16:
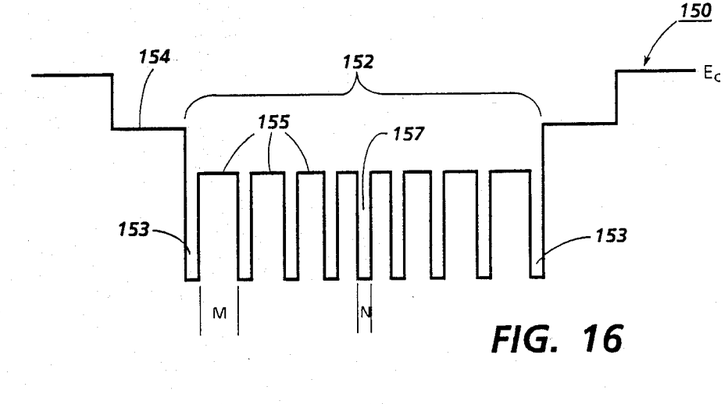
FIG. 16 is an energy band profile configuration for a separate confinement multiple quantum well structure with varying barrier widths.

The embodiment in FIG. 16 is the antithesis of the embodiment in FIG. 14. Structure 150 comprises a multiple quantum well active region 152 bounded by inner cladding layers 154 and 156 of $Ga_{1-z}Al_zAs$ to form a separate confinement multiple quantum well structure. Active region 152 comprises a plurality of wells 153 separated by barriers 155. Wells 153 are of equal width, $L_A$, while barriers 155 vary in width, $L_B$, from a maximum value, M, at the ends of region 152 to a minimum value, N, adjacent center well 157 of region 152. Wells 153, for example, may be comprised of GaAs or $Ga_{1-x}Al_xAs$, where x is s small value, e.g. 0.05 and barriers 155 may be comprised of $Ga_{1-y}Al_yAs$ where $z>y>x$. $L_B$ may, for example, be equal to M=2N where $N+L_A$ may be 30 Å.

Figure 17:
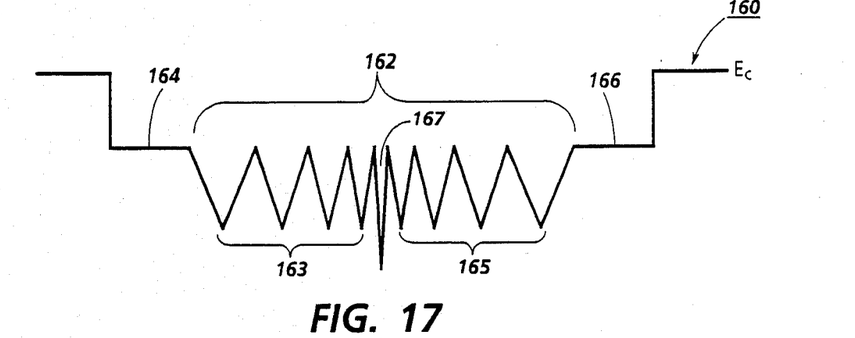
FIG. 17 is an energy band profile configuration of a thickness graded index sawtooth superlattice multiple quantum well (THCK GRIN SATH SL MQW) structure.
Figure 18:
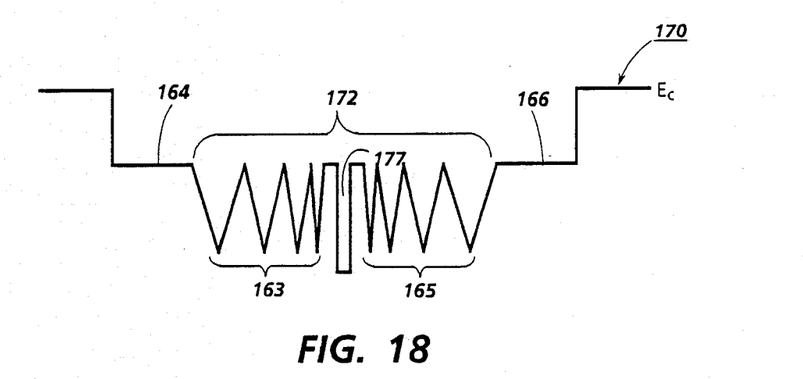
FIG. 18 is an energy band profile configuration of a SQW structure having cladding regions comprising of a thickness graded index sawtooth superlattices (THCK GRIN SATH SL).
Figure 19:
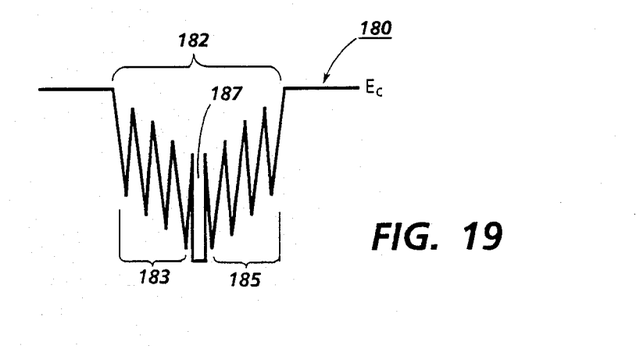
FIG. 19 is an energy band profile configuration of a SQW structure having cladding regions comprising of a compositional graded index sawtooth superlattices (COMP GRIN SATH SL).

The next group of embodiments of FIGS. 17–19 contain sawtooth superlattices in their active region. A sawtooth superlattice is a supperlattice that possesses periodic variation in compositional content as in the case of a standard superlattice of square step period. However, the sawtooth configuration varies continuously in compositional change which is easily accomplished in a MO-CVD reactor under computer control. Sawtooth superlattices in cladding regions having a constant period are illustrated in U.S. Pat. application Ser. No. 07/165,862, filed 03/09/88. However, for the purposes of the invention herein disclosed, it is preferred that there is also a continuous variance in the period thickness or compositional content of such superlattices in order to obtain an extended tuneable range of wavelengths.

In FIG. 17, there is illustrated an energy band profile for a sawtooth superlattice multiple quantum well (SATH SL MQW) structure 160. Structure 160 comprises a multiple quantum well active region 162 having a central V-shaped graded quantum well 167 bonded on both sides by a thickness graded index sawtooth superlattice (THCK GRIN SATH SL) forming inner cladding regions 163 and 165. Regions 163 and 165 have a modulated grading in refractive index between maximum and minimum values of varying compositional content and concurrently being linearly graded in refractive index value via monotonic increased thickness, i.e., an increase in the modulated period from a nimimum period adjacent to well 167 to a maximum period adjacent outer cladding layers 164 and 166. Well 167 may be comprised of GaAs or $Ga_{1-x}Al_xAs$ where x is a small value and THCK GRIN SATH SL regions 163 and 165 may have an increasing period change between minimum and maximum period values of M and N where, for example, M=2N. SL regions 163 and 165 may be comprised of $Ga_{1-y}Al_yAs$ and vary in compositional content from $Ga_{1-y}Al_yAs$ to $Ga_{1-z}Al_zAs$ where $z \geq y > x$. Cladding layers 164 and 166 are comprised of $Ga_{1-z}Al_zAs$.

Structure 170, illustrated by the energy band profile in FIG. 18, is the same as structure 160 in FIG. 17 except that the central quantum well in active region 172 is a single standard well layer 177. Thus, corresponding elements of each of these structures 160 and 170 carry the same numerical identifiers and the corresponding description is equally applicable to both embodiment. In the embodiments of FIGS. 17 and 18, the central wells 167 and 177 have lower transition energy levels than adjacent inner cladding regions 163 and 165. This is generally preferred so that electrons will be trapped and funneled into the lwoer energy levels of the central well. However, it is possible for these wells to be at the same transition energy level of the adjacent cladding regions 163 and 165, i.e., wells 167 and 177 be comprised of $Ga_{1-y}Al_yAs$.

In FIG. 19, an energy band profile is shown for another kind of GRIN SATH SL structure 180. Structure 180 comprises a quantum well 187 bounded on both sides by a compositional graded index sawtooth superlattice (COMP GRIN SATH SL) forming cladding regions 183 and 185. Cladding regions 183 and 185 have a modulated grading in refractive index between maximum and minimum values of continually varying compositional content and concurrently being linearly graded in refractive index value via compositional change from a maximum value adjacent to well 187 to a minimum value at cladding layers 183 and 185. Well 187 may be comprised of GaAs or $Ga_{1-x}Al_xAs$, where x is a small value and COMP GRIN SATH SL regions 183 and 185 may be comprised of $Ga_{1-y}Al_yAs$ with a linear grading between minimum and maximum values from $Ga_{1-y}Al_yAs$ to $Ga_{1-z}Al_zAs$ where $z > y > x$ with a modulated minimum and maximum between y and z. SL regions 183 and 185 may be provided with a larger modulated grading than that illustrated in FIG. 19.

Figure 20:
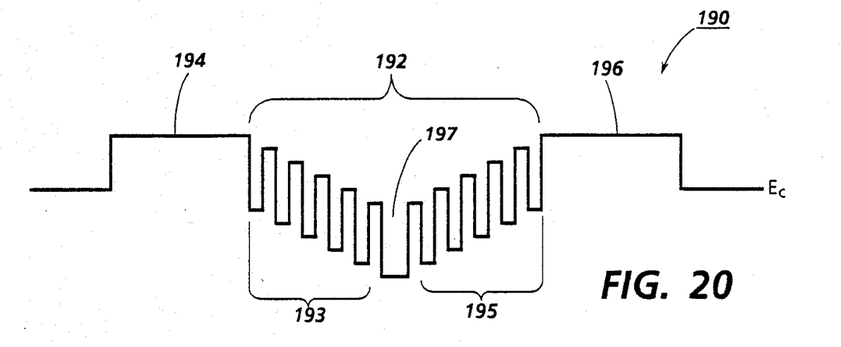
FIG. 20 is an energy band profile configuration of a SQW structure bounded by compositional graded index superlattices (COMP GRIN SL) in the cladding regions.

In FIG. 20, the energy band profile is illustrated for a SQW structure 110 comprising a quantum well 197 bounded by cladding regions 193 and 195 comprising compositional graded index superlattices (COMP GRIN SL). COMP GRIN SL regions 193 and 195 have a modulated grading in refractive index between maximum and minimum values of varying compositional content and currently being linearly graded form a minimum value adjacent to well 197 to a maximum value at cladding layers 194 and 196. Well 197 may be comprised of GaAs or $Ga_{1-x}Al_xAs$, where x is s small value and COMP GRIN SL regions 193 and 195 may have a linear grading between minimum and maximum values from $Ga_{1-y}Al_yAs$ to $Ga_{1-z}Al_zAs$, where $z > y > x$ with a modulated minimum and maximum between y and z are comprised of $Ga_{1-z}Al_zAs$.

Figure 21:
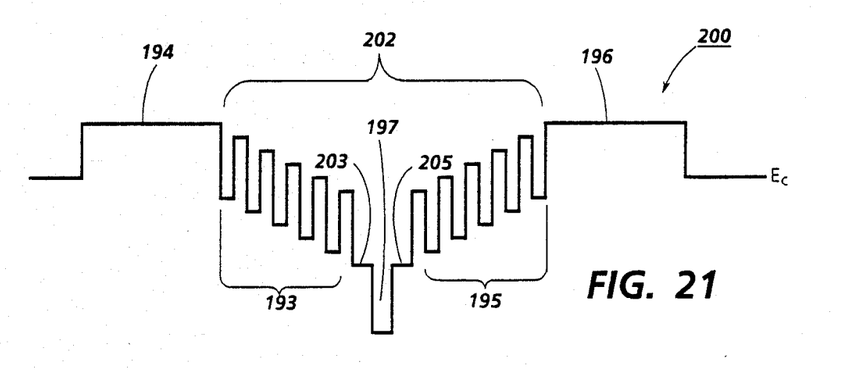
FIG. 21 is an energy band profile configuration of a separate confinement SQW structure bounded by compositional graded index superlattices (COMP GRIN SL) in the cladding regions.

In FIG. 21, COMP GRIN SL structure 200 is the same as structure 190 of FIG. 20 except that central single quantum well 197 is bounded by inner confinement layers 203 and 205 for separate confinement followed by COMP GRIN SL regions 193 and 195. Corresponding elements of each of these structures carry the smae numerical identifiers and the corresponding description for FIG. 20 is equally applicable to FIG. 21.

Figure 22:
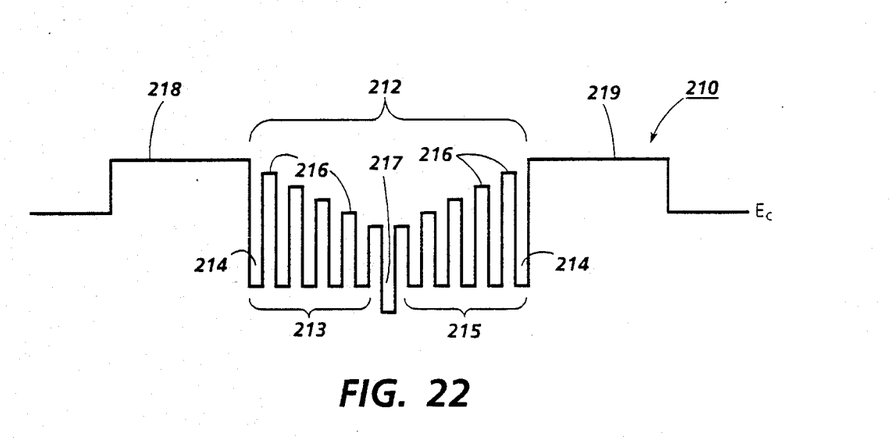
FIG. 22 is an energy band profile configuration of a SQW structure bounded by compositional graded index superlattices (COMP GRIN SL) in the cladding regions with grading variationslimited to the superlattice barriers.

In FIG. 22, an energy band profile is illustrated for a MQW structure 210 comprising an active region superlattice 212 having a quantum well 217 bounded by cladding regions 213 and 215 comprising compositional graded index superlattices (COMP GRIN SL). SL regions 213 and 215 have wells 214 with the same transition energy levels while barriers 216 contain different graduated heights ascending toward outer cladding layers 218 and 219. COMP GRIN SL regions 213 and 215 have a modulated grading in refractive index between maximum and minimum values of varying compositional content along graduated barriers 216. Well 217 may be comprised of GaAs or $Ga_{1-x}Al_xAs$, where x is a small value and COMP GRIN SL regions 213 and 215 may have cladding wells 214 of $Ga_{1-y}Al_yAs$ and graduated bariers between minimum and maximum values of $Ga_{1-w}Al_wAs$ and $Ga_{1-z}Al_zAs$ where $z > w > y > x$. Cladding layers 218 and 219 may be comprised of $Ga_{1-z}Al_zAs$.

Figure 23:
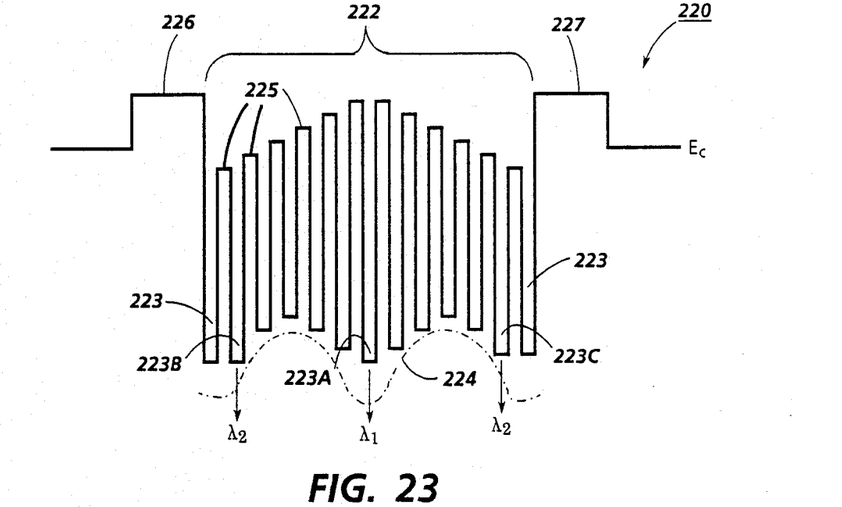
FIG. 23 is an energy band profile configuration of a sinusoidal compositional graded index superlattice (COMP GRIN SL).

In FIG. 23, there is illustrated a MQW structure 220 which has a sinusoidal COMP GRIN SL active region 222 formed between cladding layers 226 and 227 comprising alternating wells 223 and barriers 225 having a periodic variation across the region in compositional content which is sinusoidal, in effect, relative to quantum wells 223 as indicated by dotted line 224, and, simultaneously, is gradually ascending and then descending relative to barriers 225. The result of this structure is that three wells 223A, 223B and 223C have the same transition energy level, which are the lowest levels in SL region 222 so that lasing will occur at these points. Since the barrier heights at these particular wells are different, e.g., the barrier heights adjacent to well 223 A are different from the barriers adjacent to wells 223B and 223C, the wavelength emission characteristics at wells 273A and wells 223B and 223C will be independently different. The emission wavelength at the region of well 223 A will be $\lambda_1$ while the emission wavelength will be about the same at the region of wells 223 B and 223C, i.e. $\lambda_2$. Wells 223 may be comprised of $Ga_{1-x}Al_xAs$ where x varies, for example, between 0 and 0.10. Barriers 225 may be comprised of $Ga_{1-y}Al_yAs$ where y, for examle, varies between 0.40 and 0.60. Cladding layers 226 and 227 may be $Ga_{1-z}Al_zAs$ where in z may be, for example, in the range of 0.60 to 0.80.

Figure 24:
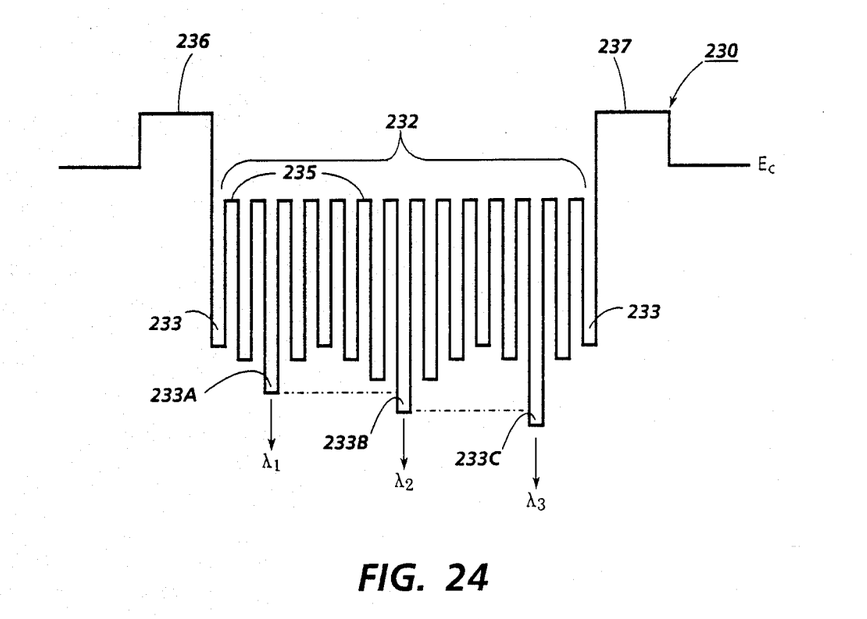
FIG. 24 is an energy band profile configurationof another embodiment of a sinusoidal compositional graded index superlattice (COMP GRIN SL).

In FIG. 24, there is illustrated the energy band profile for MQW structure 230 having a sinusoidal COMP GRIN SL active region 232 formed between cladding layers 236 and 237 and comprising alternating wells 233 and barriers 235 with a periodic variation in compositional content across the region in wells 233 which is sinusoidal, in effect. However, barriers 235 are at equal hekght vis a vis to active region barriers 225 in FIG. 23. Further, a plurality of wells have lower transition energy levels in descending order, e.g. wells 233A, 233B and 233C so that lasing will occur at these points respectively at dominate emission wavelengths $\lambda_1$, $\lambda_2$ and $\lambda_3$. Wessl 233 may be comprised of $Ga_{1-x}Al_xAs$ when x varies, for example, between 0 and 0.10. Barriers 255 may be comprised of $Ga_{1-y}Al_yAs$ where, for example y varies between 0.40 and 0.60. Cladding layers 236 and 237 may be, for example, in the range of 0.60 to 0.80.

Embodiments of FIGS. 23 and 24 contain MQW superlattices having several deep quantum well regions to provide a plurality of dominate operating wavelengths. Layers incorporating these structures may also be tuned to in-between wavelengths using the tuning system of FIG. 1.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a wavelength tunable semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron states and having more than one energy band,
   means to tune said laser to any wavelength represented by a plurality of subband electron/hole states established within said well energy bands,
   the elemental composition of said wells or of said barriers or both is sequentially changed across said active region to increase the number of allowable subbands between said energy bands and correspondingly increase the tuning wavelength selectivity of said laser,
   said active region comprising N wells, W, of $Ga_{1-x}Al_xAs$ and M barriers, B, of $Ga_{1-x'}Al_{x'}As$ wherein either x increases sequentially across said wells so that x in $W_1 > W_2 > W_3 > \ldots W_N$ or decreases sequentially across said wells so that x in $W_1 < W_2 < W_3 < \ldots W_N$ in combination wherein either x' increases sequentially across said barriers so that x' in $B_1 > B_2 > B_3 > \ldots B_M$ or decreases sequentially across said wells so that x in $B_1 < B_2 < B_3 < \ldots B_M$.

2. The wavelength tunable semiconductor laser of claim 1 wherein in said sequential increase or decrease of x and x' occur in the same direction.

3. The wavelength tunable semiconductor laser of claim 4 wherein in said sequential increase or decrease of x and x' occur in an opposite direction.

4. In a semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron sates and having more than one energy band and wherein there is central well means of approximately the lowest energy level,
   the improvement wherein the elemental composition of said wells and/or or said barriers is monotonically increased across said active region in opposite directions from said central well means.

5. In a multiple wavelength semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron states and having more than one energy band,
   the improvement wherein the elemental composition of said wells and/or of said barriers is varied in a sinusoidal fashion across said active region to provide two or more dominate operating wavelengths for said laser.

6. In a semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron states and having more than one energy band and wherein there is central well means of approximately the lowest energy level,
   the improvement wherein the elemental composition in at least some of said wells and barriers is modulated thereacross thereby providing a modulated grading in refractive index between maximum and minimum values of continually varying compositional content relative to individual of said wells and barriers and concurrently being linearly graded in refractive index value across said active region with a maximum value thereof adjacent to said central well means to a minimum value at the outer boundaries of said active region.

7. In a semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron states and having more than one energy band and wherein there is central well means of approximately the lowest energy level,
   the improvement wherein the elemental composition in each of said wells and barriers except for said central well means is modulated thereacross thereby providing a modulated grading in refractive index between maximum and minimum values of continually varying compositional content relative to individual of said wells and barriers and concurrently being linerarly graded in refractive index value across said active region with a maximum value thereof adjacent to said central well means to a minimum value at the outer boundaries of said active region.

8. In a semiconductor laser comprising
   a plurality of contiguous semiconductor layers deposited on a substrate,
   one of said layers being an active region comprising a multiple quantum well configuration having two or more quantum wells separated by barriers wherein said wells are capable of quantization of electron states and having more than one energy band and wherein there is central well means of approximately the lowest energy level,
   the improvement wherein the elemental composition in at least some of said wells and barriers is modulated thereacross thereby providing a modulated grading in refractive index between maximum and minimum values of varying compositional content relative to individual of said wells and barriers and concurrently being linearly graded in refractive index value across said active region via an increase in the modulated period from a minimum period adjacent to said central well means to a maximum period at the outer boundaries of said active region.

9. In a semiconductor laser comprising a plurality of contiguous semiconductor layers deposited on a substrate, one of said layers being an active region comprising a multiple quantum well configuration having two or more quantum wells separated by barriers wherein said wells are capable of quantization of electron states and having more than one energy band and wherein there is central well means of approximately the lowest energy level, the improvement wherein the elemental composition in each of said wells and barriers except for said central well means is modulated thereacross thereby providing a modulated grading in refractive index between maximum and minimum values of varying compositional content relative to individual of said wells and barriers and concurrently being linearly graded in refractive index value across said active region via an increase in the modulated period from a minimum period adjacent to said central well means to a maximum period at the outer boundaries of said active region.

* * * * *